(12) United States Patent
Miao

(10) Patent No.: US 7,773,016 B2
(45) Date of Patent: Aug. 10, 2010

(54) SWITCHING CONVERTERS CONTROLLED VIA SIGMA DELTA MODULATION

(75) Inventor: Botao Miao, Sunnyvale, CA (US)

(73) Assignee: Analog Devices, Inc., Norwood, MA (US)

( * ) Notice: Subject to any disclaimer, the term of this patent is extended or adjusted under 35 U.S.C. 154(b) by 89 days.

(21) Appl. No.: 12/286,661

(22) Filed: Sep. 29, 2008

(65) Prior Publication Data
US 2010/0079323 A1    Apr. 1, 2010

(51) Int. Cl.
*H03M 1/00* (2006.01)
(52) U.S. Cl. .................. 341/142; 341/143; 323/282; 323/283
(58) Field of Classification Search .......... 341/143, 341/142; 323/282–285
See application file for complete search history.

(56) References Cited

U.S. PATENT DOCUMENTS

| | | | | |
|---|---|---|---|---|
| 5,514,947 | A * | 5/1996 | Berg | 323/282 |
| 5,677,618 | A | 10/1997 | Fiez et al. | 323/282 |
| 5,894,243 | A | 4/1999 | Hwang | 327/540 |
| 6,023,416 | A | 2/2000 | Shikata et al. | 363/17 |
| 6,366,070 | B1 * | 4/2002 | Cooke et al. | 323/284 |
| 6,542,385 | B1 | 4/2003 | Emmons et al. | 363/17 |
| 6,621,257 | B2 * | 9/2003 | Mitamura et al. | 323/282 |
| 6,784,648 | B2 * | 8/2004 | Mitamura et al. | 323/282 |
| 7,075,280 | B2 | 7/2006 | May | 323/284 |
| 7,098,632 | B2 | 8/2006 | Chen et al. | 323/222 |
| 7,180,439 | B1 | 2/2007 | Bakker | 341/155 |

OTHER PUBLICATIONS

Maksimovi, Dragan, et al., "Imapact of Digital Control in Power Electronics", Procedings of 2004 International Symposium - - - Power Devices & IC's, May 2004, pp. 13-22.
Trescases, Olivier, et al., "A Low-Power Mixed-Signal Current-Mode DC-DC Converter Using a One-bit ΔΣ DAC", IEEE APEC, Mar. 2006, pp. 700-704.
Miao, Botao, et al., "ΔΣ ADC based Current Mode Power Supply Controller with Digital Voltage Loop", Applied Power Electronics Conference, Feb. 2008, pp. 1582-1588.

* cited by examiner

*Primary Examiner*—Khai M Nguyen
(74) *Attorney, Agent, or Firm*—Koppel, Patrick, Heybl & Dawson

(57) ABSTRACT

Low-cost switching converter systems are provided which combine analog generation of a current signal with digital generation of a loop error signal that is realized with a control loop that includes a high-resolution, low-bandwidth sigma-delta modulator and a low-resolution digital-to-analog converter. The current signal and error signal are differenced to provide a control signal to the switching converter. This economical system structure facilitates quick and easy digital alteration of system parameters (e.g., loop compensation and voltage reference). System embodiments add a high-frequency analog feedback path in parallel with the control loop to supplement and enhance its control performance.

17 Claims, 6 Drawing Sheets

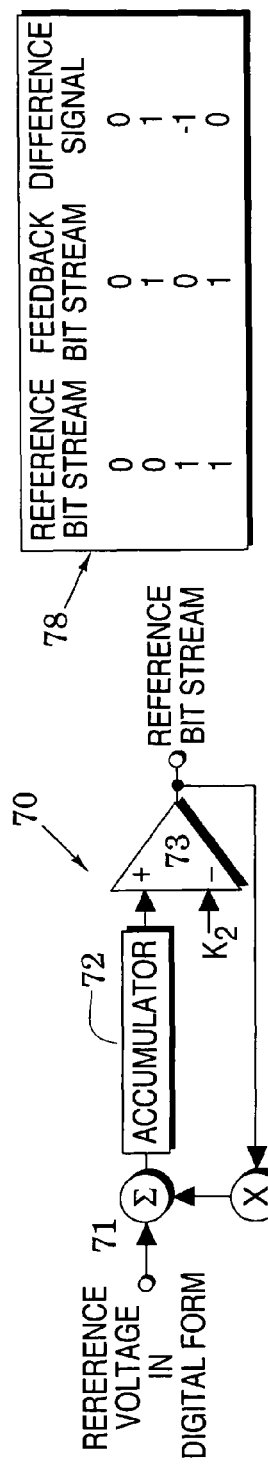
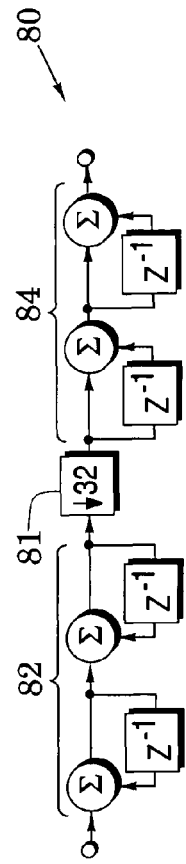
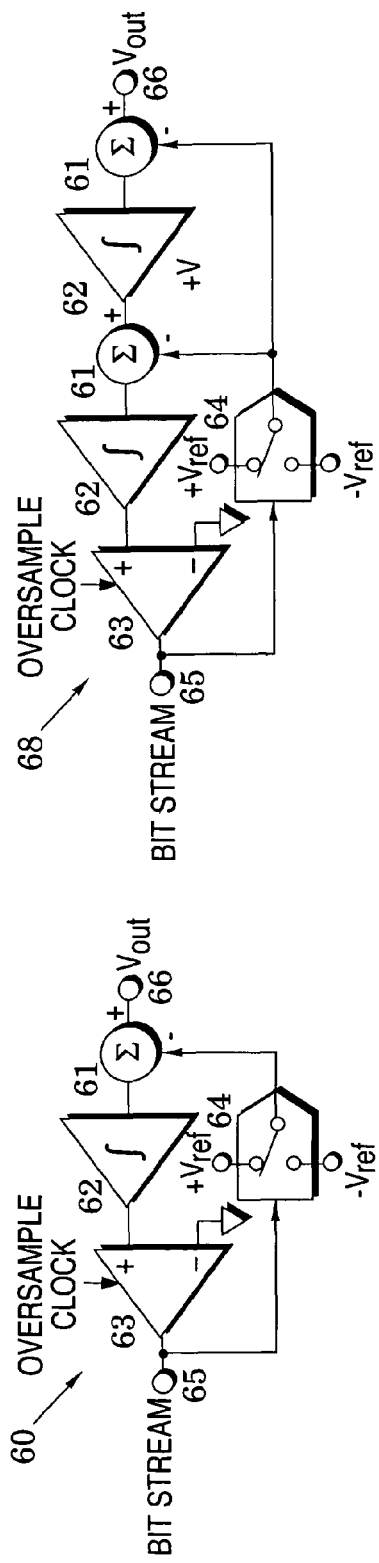

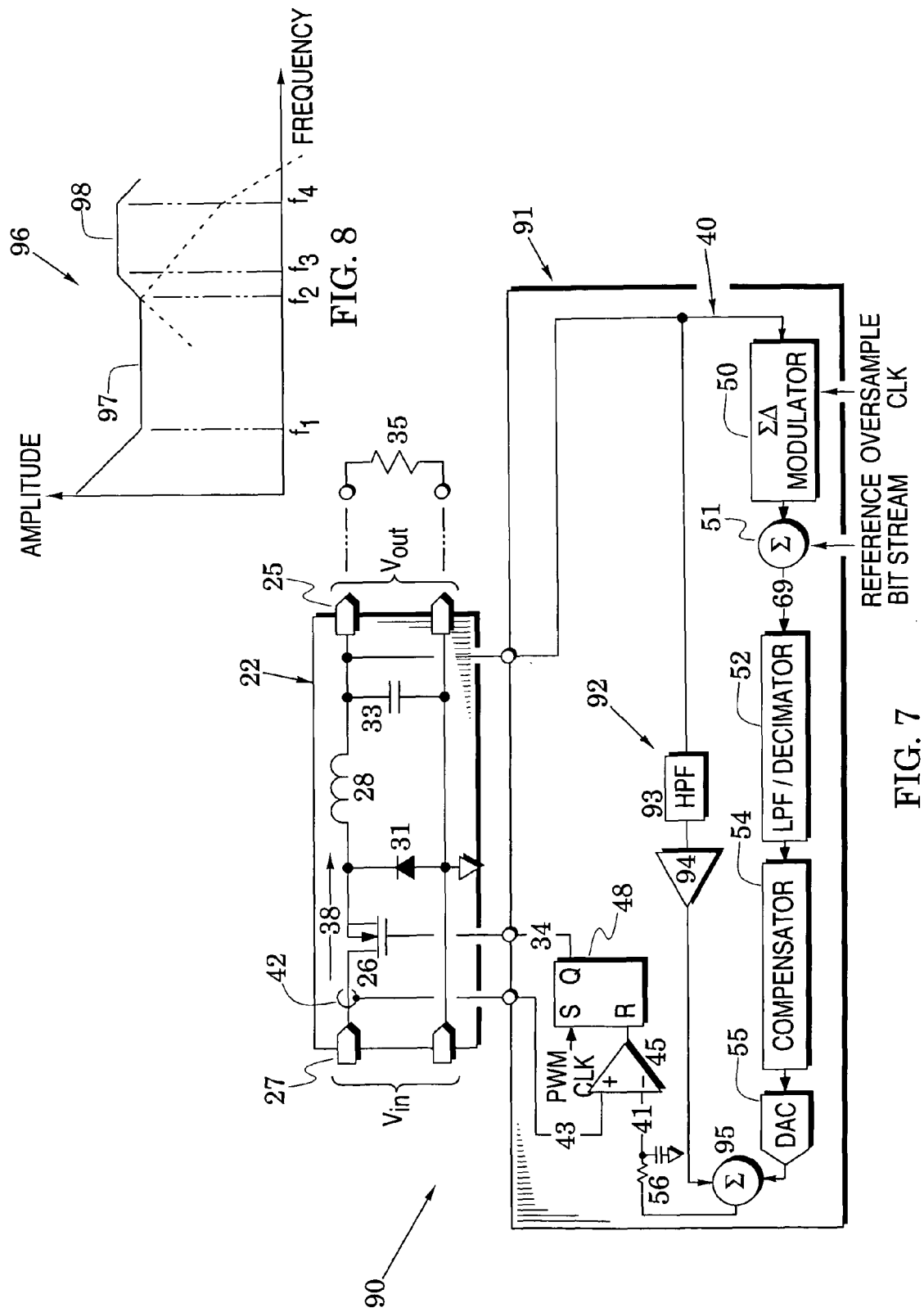

US 7,773,016 B2

SWITCHING CONVERTERS CONTROLLED VIA SIGMA DELTA MODULATION

BACKGROUND OF THE INVENTION

1. Field of the Invention

The present invention relates generally to switching converters.

2. Description of the Related Art

Switching converters (also commonly referred to as switched-mode power supplies) are widely used to provide low, tightly regulated DC voltages to electronic loads from a direct current (DC) source (e.g., a DC voltage bus or a battery voltage). They precisely regulate output voltages in the presence of dynamic load current variations for a wide range of products such as hand-held, laptop, and desktop computers, mobile phones, servers and other battery-powered, portable electronics.

Increasing numbers of switching converter systems are becoming "digital" in some aspect of this word. For example, "digital wrappers" have been added to enhance operational flexibility and provide monitoring of converters which are otherwise analog in structure. In more fundamental changes, some or all of a system's feedback control loop has been realized with digital structures. These control loops, however, have typically been structured with expensive high-bandwidth and high-accuracy analog-to-digital converters and pulse-width modulators. In different versions, they have included predictive control algorithms, high-resolution analog-to-digital converters and complex processing (e.g., with digital signal processors). Accordingly, digitally-controlled converters have generally been substantially more expensive than their analog versions.

BRIEF SUMMARY OF THE INVENTION

The present invention is generally directed to economical switching converter systems. The drawings and the following description provide an enabling disclosure and the appended claims particularly point out and distinctly claim disclosed subject matter and equivalents thereof.

BRIEF DESCRIPTION OF THE DRAWINGS

FIGS. 3A and 3B are diagrams that illustrate different embodiments of a sigma-delta modulator in the converter of FIG. 1;

FIG. 4 is a diagram of a reference generator embodiment for use with the converter of FIG. 1;

FIG. 5 is a table that illustrates signal states of a differencer in the converter of FIG. 1;

FIG. 6 is diagram of an lpf/decimator embodiment for use in the converter of FIG. 1;

FIG. 7 is a diagram of another switching converter system embodiment;

FIG. 8 is a diagram of a control loop transfer function in the converter of FIG. 7.

DETAILED DESCRIPTION OF THE INVENTION

FIGS. 1-10 illustrate low-cost switching converter systems that combine analog generation of a current signal with digital generation of a loop error signal that is realized with a control loop that includes a high-resolution, low-bandwidth sigma-delta modulator and a digital-to-analog converter. The current signal and error signal are differenced to provide a control signal to the switching converter. This economical system structure facilitates quick and easy digital alteration of system parameters (e.g., loop compensation and voltage reference). System embodiments add a high-frequency analog feedback path in parallel with the control loop to supplement and enhance its control performance.

Figure 1:
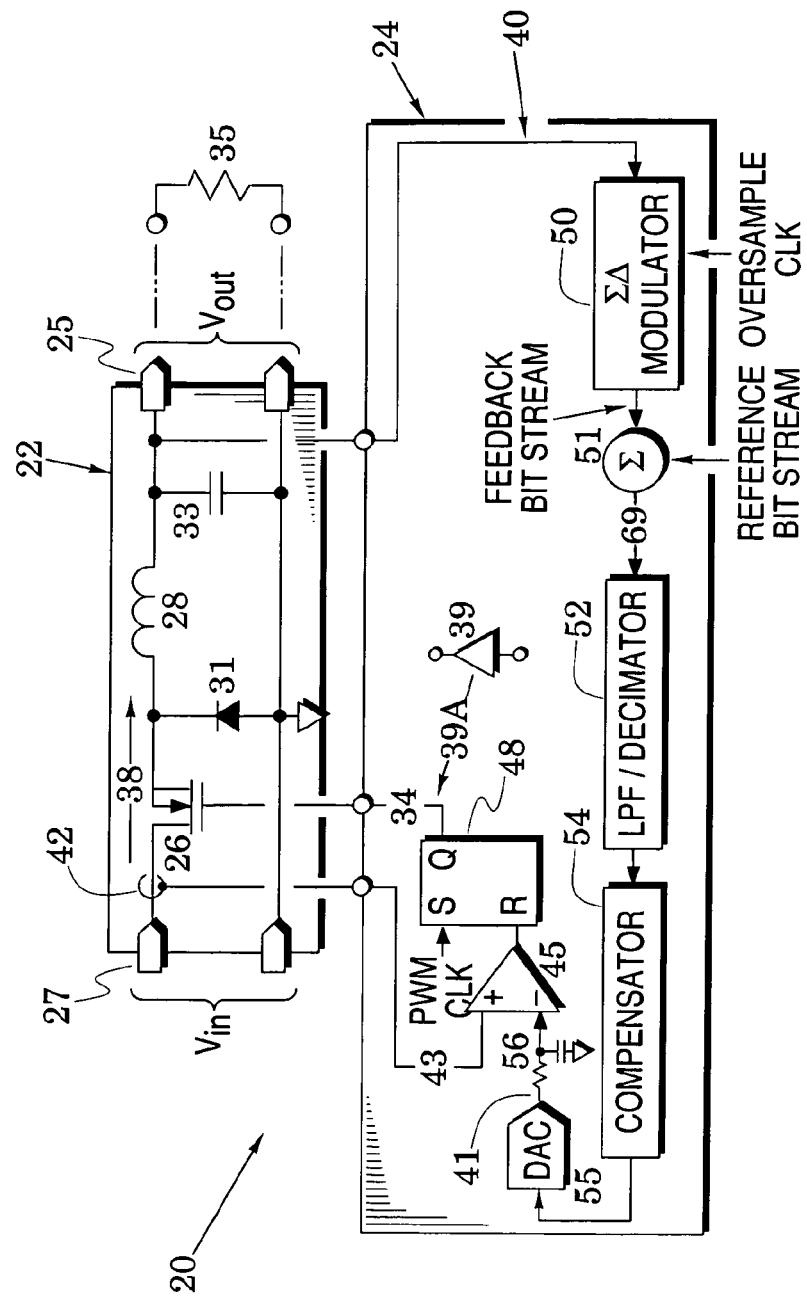
FIG. 1 is a diagram of a switching converter system embodiment.

In particular, FIG. 1 illustrates a switching converter system embodiment 20 that comprises a switching converter 22 in a buck configuration and a controller 24 wherein the converter responds to the controller to thereby generate a controlled output voltage $V_{out}$ at an output port 25. In an embodiment, the converter 22 includes a switch 26 coupled to an input port 27 and an inductor 28 that is coupled between the transistor and the output port 25. A semiconductor diode 31 is coupled from the junction between the transistor and the inductor to ground and a capacitor 33 is coupled across the output port 25.

In a converter embodiment, the switch 26 is formed as a metal-oxide semiconductor field-effect transistor (MOSFET) which responds to a pulse-width modulated (PWM) control signal 34 at its control terminal (i.e., its gate). The frequency of the PWM control signal is set by the frequency of a PWM clock provided to a latch of the controller 24. Details of the converter will be described subsequent to an initial description of operation of the converter 22. The output voltage $V_{out}$ is provided to drive various loads across the output port 25, e.g., a resistive load 35 is shown to represent such loads.

In operation, the control signal 34 has a duty cycle D so that the transistor 26 is switched on for a fraction D of each period of the control signal. The transistor is then switched off during the remainder of each period. When the transistor is turned on, it directs a switch current 38 to a low-pass filter formed by the inductor 28 and capacitor 33. When the transistor is switched off, the diode 31 passes a current which initially supports the current 38 and then decays throughout the remainder of the period. Application of the control signal 34 to the control terminal of the transistor 26 may be facilitated via a driver 39 which is shown inserted into the controller 24 by an insertion arrow 39A in FIG. 1.

Preferably, the transistor acts as a perfect switch so that it has zero impedance when it is on (as determined by the duty cycle D) and has infinite impedance otherwise. Thus, dissipation in the transistor would be zero because the voltage across the transistor 26 would be zero during the first portion of each period of the control signal 34 and the current through the transistor would be zero during the remaining portion. Although a real transistor will not meet these ideal parameters, it can approximate them to thereby substantially reduce power dissipation in the transistor.

In response to the control signal 34, the switched transistor 26 applies a pulse-width modulated signal with amplitude $V_{in}$ and duty cycle D to the inductor 28. If the corner frequency of the filter's transfer function is sufficiently less than the switching frequency of the transistor 26, the filter passes only the dc component (i.e., average) of the pulse-width modulated signal. The output voltage $V_{out}$ at the output port 25 is thus a function of the duty cycle D and the input voltage $V_{in}$.

In an embodiment, the controller 24 of FIG. 1 includes a feedback control loop 40 configured to digitally generate an error signal 41 in response to the difference between a reference bit stream and a feedback bit stream whose average amplitude corresponds to the output voltage $V_{out}$ at the output port 25. In addition, a current sensor 42 (e.g., a small resistor)

provides a current signal 43 that indicates the magnitude of the input current 38 through the transistor 26. When the current signal 43 exceeds the error signal 41, a comparator 45 resets a latch (e.g., a flip-flop) 48 which was set by a clock shown in FIG. 1 as a PWM CLK.

Figure 2:
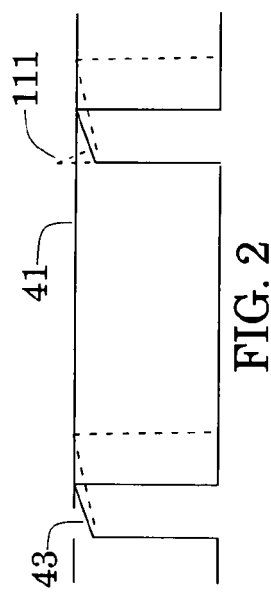
FIG. 2 is a sketch that shows current and error signals in the converter of FIG. 1.

FIG. 2 indicates a typical relationship between the error signal 41 and the current signal 43 in which it is initially assumed that the input voltage $V_{in}$ at the input port 27 is constant. The level of the error signal 41 is determined by the control loop 40 in its response to the reference bit stream. When the transistor 26 is turned on, the current 38 begins to ramp up at a rate principally determined by the inductance of the inductor 28. Accordingly, the current signal 43 defines a similar upward ramp in FIG. 2.

When this ramp crosses the error signal 41, the comparator 45 in FIG. 1 resets the latch 48 so that the control signal 34 turns off the transistor 26. Action of the feedback control loop 40 will automatically adjust the level of the error signal 41 to hold the output voltage $V_{out}$ at a level consistent with the reference bit stream. The repetition frequency of the current signal 43 is set by the frequency of the PWM clock that is applied to the set port of the latch 48.

The feedback structure and process described above maintains the desired output voltage $V_{out}$ even when the magnitude of the load changes. Although it will also maintain the output voltage $V_{out}$ when the input voltage $V_{in}$ varies, this latter process is somewhat delayed because the effect must first pass through the switching converter to cause a change in the output voltage. Only then, will the action of the feedback loop 40 sense the change and effect a correction via the error signal 41.

However, the current sensor 42 and its application through the comparator 45 directly alters the duty cycle D in response to a change in the input voltage $V_{in}$ so as to maintain the desired output voltage $V_{out}$. For example, a decrease in the input voltage $V_{in}$ will cause a decrease in the current 38 so that the slope of the current signal 43 drops as indicated by broken lines in FIG. 2. The comparator 45 will only reset the latch 48 when the reduced slope crosses the error signal. It is apparent in FIG. 2 that this process has increased the duty cycle to thereby maintain a constant output voltage $V_{out}$. It is important to note that this action is immediate and does not have to cycle through the feedback loop 40.

Attention is now redirected to the feedback loop 40 which includes a sigma-delta (ΣΔ) modulator 50, a differencer 51, a low-pass filter and decimator 52, a compensator 54, a digital-to-analog converter (DAC) 55, and a filter 56. In an embodiment, the ΣΔ modulator can be formed as the first-order modulator 60 of FIG. 3A which includes an integrator 62 coupled between a differencer 61 and a one-bit analog-to-digital converter in the form of a comparator 63. A one-bit digital-to-analog converter (DAC) 64 drives the summer 61 in response to an output bit stream generated by the comparator at an output port 65. In FIG. 3A, the modulator is arranged from right to left to correspond to its arrangement in FIG. 1. In addition, the output voltage $V_{out}$ of the converter 22 in FIG. 1 is shown as the input at the right side of the modulator in FIG. 3A.

In operation of the modulator 60, the comparator delivers a bit stream to the output port 65 at the frequency of an oversample clock. In response to this bit stream, the DAC 64 applies a feedback stream of selected ones of two reference voltages (+$V_{ref}$ and −$V_{ref}$) to the differencer 61 which provides the difference between this stream and the bit stream at an input port 66 to the integrator 62. The integrator provides an integrated version of the difference to the comparator 63.

The feedback through the DAC 64 maintains the DC level of the output of the integrator 62 near the reference level of the comparator 63. Action of the ΣΔ modulator 60 then provides the bit stream at the output port 65 whose average analog value closely approximates the analog voltage at the input port 66 (which is shown as an output voltage $V_{out}$ because it comes from the output port 25 in the system 20 of FIG. 1).

It is important to note that a ΣΔ modulator can significantly spread out and thus lower quantization noise. This follows because quantization noise of the ΣΔ modulator is spread over the region below one half of the oversample clock frequency so that the noise density lowers as the frequency of this clock increases. In addition, action of the integrator 62 shapes this noise by shifting most of it to the higher-frequency portion of this region.

The noise shaping can be further enhanced with higher-order embodiments of ΣΔ modulators. FIG. 3B shows, for example, a second order ΣΔ modulator 68 that is formed by inserting a second differencer 61 and a second integrator 62 ahead of the first differencer and integrator and providing a second feedback path between the DAC 64 and the second differencer. In embodiments, the modulators of FIGS. 3A and 3B can be effectively realized with switched-capacitor structures.

If the bit stream from the ΣΔ modulator is low-pass filtered to insure against aliasing and then decimated to a significantly-lower clock frequency (e.g., the frequency of the compensator 54 and DAC 55), the majority of the shaped and spread quantization noise is rejected to thereby realize a significantly enhanced signal-to-noise ratio (SNR). The noise shaping of the modulator 60 of FIG. 3A, for example, can facilitate an SNR improvement of 9 dB for each doubling of the clock frequency and that of the modulator 66 of FIG. 3B an improvement of 15 dB. The decimation determines an oversampling ratio (OSR) and in an embodiment in which the OSR is 16 ($2^4$), the noise shaping of the second order modulator 66 would thus facilitate an SNR improvement of 75 dB. Because the effective number of bits (ENOB) is known to be given by (SNR−1.76 dB)/6.02, this provides an ENOB of 9. In effect, the noise shaping and subsequent filtering and decimation has realized a higher resolution signal.

In the controller 24, the feedback bit stream from the ΣΔ modulator 50 is differenced in the differencer 51 with a reference bit stream which represents the desired level of the output voltage $V_{out}$ at the output port 25. As shown in FIG. 1, this process forms a difference signal 69 which is then low-pass filtered and decimated in the lpf/decimator 52. The compensator 54 then processes the output of the lpf/decimator 52 to stabilize the control loop 40. Finally, the output of the compensator is applied to the DAC 55 which generates the error signal 41. It is important to note that, in this digital feedback structure, the low-pass filtering and decimation is performed on the difference signal 69 rather than on the feedback bit stream. The filter 56 is configured as a low-pass filter (e.g., as shown with a series resistor followed by a shunt capacitor) to provide a high-frequency pole in the transfer function. This pole serves to filter out high frequency noise.

The reference bit stream in FIG. 1 may be generated with a reference bit stream generator such as the embodiment 70 shown in FIG. 4. This embodiment includes a digital accumulator 72 coupled between an input differencer 71 and a comparator 73. The output of the comparator is fed back to be multiplied in a multiplier 74 by a digital constant $K_1$. The output of the multiplier is provided to the differencer 71 where it is subtracted from the digital representation of the reference voltage. The comparator 73 compares the output of the latch to a second digital constant $K_2$ to produce the reference bit stream.

In operation, the reference voltage may be expressed with a resolution that is provided by several bits (e.g., 8 bits). The generator 70 operates in response to the oversample clock so that the reference bit stream and feedback bit stream are coincident at the differencer 51 of FIG. 1 to produce the difference signal (69 in FIG. 1). Operation of the differencer is illustrated in the table 78 of FIG. 1 which shows that the resulting difference signal is a three-level signal. Accordingly, it can be communicated to the lpf/decimator 52 by a two-bit signal.

FIG. 6 illustrates an embodiment 80 of the LPF/Decimator 52 of FIG. 1. This embodiment is a cascaded-integrator-comb (CIC) structure which comprises a downsampling block 81 coupled between an integrator section 82 which operates at the high frequency of the oversample clock and a comb section which operates at the considerably lower frequency of the compensator 54 and DAC 55 in FIG. 1. In this second-order sinc embodiment, the integrator section is formed of two stages of integrators, the comb section is formed of two comb filters and the downsampling block decimates by a factor of 32 (i.e., this embodiment is configured to correspond to an OSR of 32). Register overflow in the integrators can be avoided with sufficient register size (e.g., 11 bits) and by implementing the filter in two's complementary logic to facilitate number wraparound.

FIG. 7 illustrates another system embodiment 90 that includes elements of the system 20 of FIG. 1 with like elements indicated by like reference numbers. In contrast, however, the feedback control loop 40 is supplemented with a high-frequency analog path 92 that includes a high pass filter 93 followed by an amplifier 94. The output of the amplifier is summed in a summer 95 with the analog output of the DAC 55 to form the error signal 41 which is also passed through the filter 56. A controller 91 is thus realized which provides feedback through a high-frequency analog path to enhance the frequency response of the control loop 40.

The graph 96 of FIG. 8 illustrates that the combined control loop may have an exemplary transfer function that includes a low-frequency portion 97 and a high-frequency portion 98. The low-frequency portion 97 is formed by the control loop 40 (introduced in FIG. 1). In particular, the compensator 54 is configured to introduce a pole at the origin followed by a loop-stabilizing zero at frequency $f_1$. The lpf/decimator introduces a pole at frequency $f_2$ which basically sets the loop bandwidth to be in the neighborhood of this pole. The compensator zero insures loop stability by providing phase margin at the edge of the loop bandwidth.

In the absence of the high-frequency portion 98, the loop transfer function would continue downward as indicated by a broken line. The high-frequency portion 98 is formed by the analog path 92 of FIG. 7 and is defined by a pole at frequency $f_3$ which is contributed by the high-pass filter 93 (a lower frequency part of the portion 98 is indicated by a broken line). As shown, the low-pass filter 56 of FIG. 7 contributes another pole at a frequency $f_4$ to filter out high frequency noise and enhance loop attenuation at high frequencies. The combined transfer function is shown in solid lines. Because the wide bandwidth analog path 92 enhances dynamic response, the feedback loop 40 can be configured to concentrate on other loop parameters (e.g., high SNR) with less concern for high-frequency response.

In configuring disclosed converter system embodiments, the PWM clock frequency is generally chosen as a compromise between switching loss and component size in the converter 22. A higher PWM frequency reduces the size of components (e.g., the inductor 28 and capacitor 33 of FIG. 1) but increases turn-on and turn-off losses in semiconductor elements (e.g., the transistor 26 and diode 31 of FIG. 1). In an exemplary converter embodiment, the PWM frequency can be set at 100 kHz. The bandwidth of the control loop 40 is typically set at 1/10 of the PWM frequency so that, in this example, the frequency $f_2$ of FIG. 8 would be in the vicinity of 10 kHz. As noted above, dynamic controller response above this frequency can be provided through the analog path 92

The loop sample frequency after decimation must be at least twice the loop bandwidth to avoid signal aliasing, i.e., it must be at least 20 kHz. If it is set conservatively at 50 kHz and the ΣΔ modulator's oversample clock is set at 1.6 MHz, then an OSR of 32 is realized. Quantization noise shaping of the ΣΔ modulator will position a large majority of the noise well above 25 kHz so that this noise will be substantially removed by the low-pass filtering process of the lpf/decimator 52. As shown in FIG. 5, the difference signal has three levels (which can be represented by a two bit signal) and the averaging of the low-pass filtering will generate a large number (e.g., 65) of levels. The lpf/decimator 52 provides a number of bits (e.g., 12) that is sufficient to store and pass this information to the compensator 54 which establishes the loop bandwidth of 10 kHz. Because the loop bandwidth can be set relatively low, various techniques (e.g., ΣΔ techniques and dithering) can be used to increase the resolution of the DAC 55 (e.g., from 8 bits to 11 bits).

The descriptions above provide controller architectures in which an output voltage is converted to a feedback bit stream (i.e., a stream having only the values of one or zero) by a ΣΔ modulator and this stream is differenced with a reference bit stream to provide a difference signal (69 in FIG. 1). The difference signal is converted to a higher resolution signal by a low pass and decimation filter (52 in FIG. 1). A compensator (54 in FIG. 1) computes an error signal which is converted to analog form (41 in FIG. 1) with a DAC (55 in FIG. 1). In a system embodiment, a high frequency component of the output voltage is used to generate the high frequency component of the error signal through an analog path (92 in FIG. 7). An analog comparator (45 in FIG. 1) is used to compare the error signal to a current signal (a measure of the current 38 in FIG. 1) to thereby control a converter transistor (26 in FIG. 1).

In these system embodiments, digital loop structures perform complex and slow control functions and analog loop structures perform simple and fast control functions. Although the ΣΔ modulator, lpf/decimator, and DAC of the control loop introduce delays, they are acceptable in the low frequency range of the digital loop.

Figure 9:
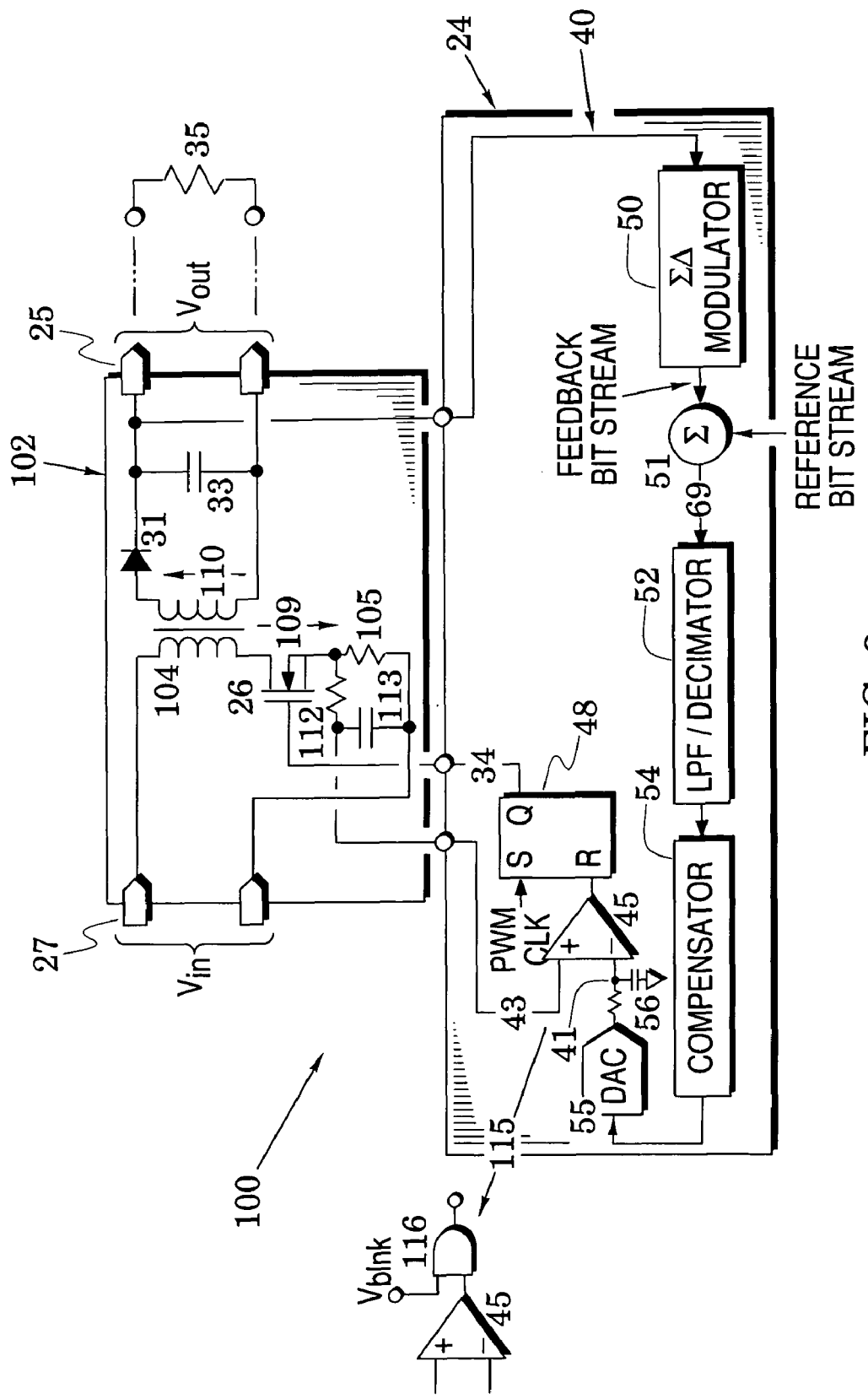
FIGS. 9, 10 and 11 are diagrams of other switching converter system embodiments.

Attention is now directed to FIG. 9 which illustrates a flyback switching converter system embodiment 100 that includes elements of the system 20 of FIG. 1 with like elements indicated by like reference numbers. In contrast, however, a converter 102 of the system 100 includes a flyback transformer 104 having a primary winding coupled in series with the transistor 26 and a resistor 105 which acts as a current sensor. The diode 31 and capacitor 33 are respectively arranged in series and in shunt with the secondary of the flyback transformer 104.

In a first operational phase of the system 100, the transistor 26 conducts a current 109 and energy is stored in a primary winding of the transformer. Accordingly, the flyback transformer is preferably configured to enhance this energy storage. In a second operational phase, the transistor is off and a current 110 transfers energy to the load 35 and the capacitor 33 via the secondary winding of the transformer. The capacitor thus transfers energy to the load during the second operational phase.

As shown in FIG. 2, there is a tendency for all converter embodiments to generate a switching spike at the leading edge of the current signal 43 each time the transistor 26 turns on (for illustrative purposes, the spike 111 is shown on only one of the PWM pulses in FIG. 2). This switching spike can disrupt the intended action of the latch 48 and cause premature turn off the transistor 26.

As shown in FIG. 9, a filter can be formed with a resistor 112 and a capacitor 113 that are serially coupled about the current sensor resistor 105 with the junction between these elements providing the current signal 43. Although this filter generally suppresses the switching spike, an arrow 115 in FIG. 9 indicates that an AND gate 116 can also be inserted between the comparator 45 and the latch 48. A blanking pulse $V_{blnk}$ is applied to the gate and this pulse is arranged to be low for at least the duration of the switching spike (111 in FIG. 2) so that this spike is ignored by the latch 48.

Figure 10:
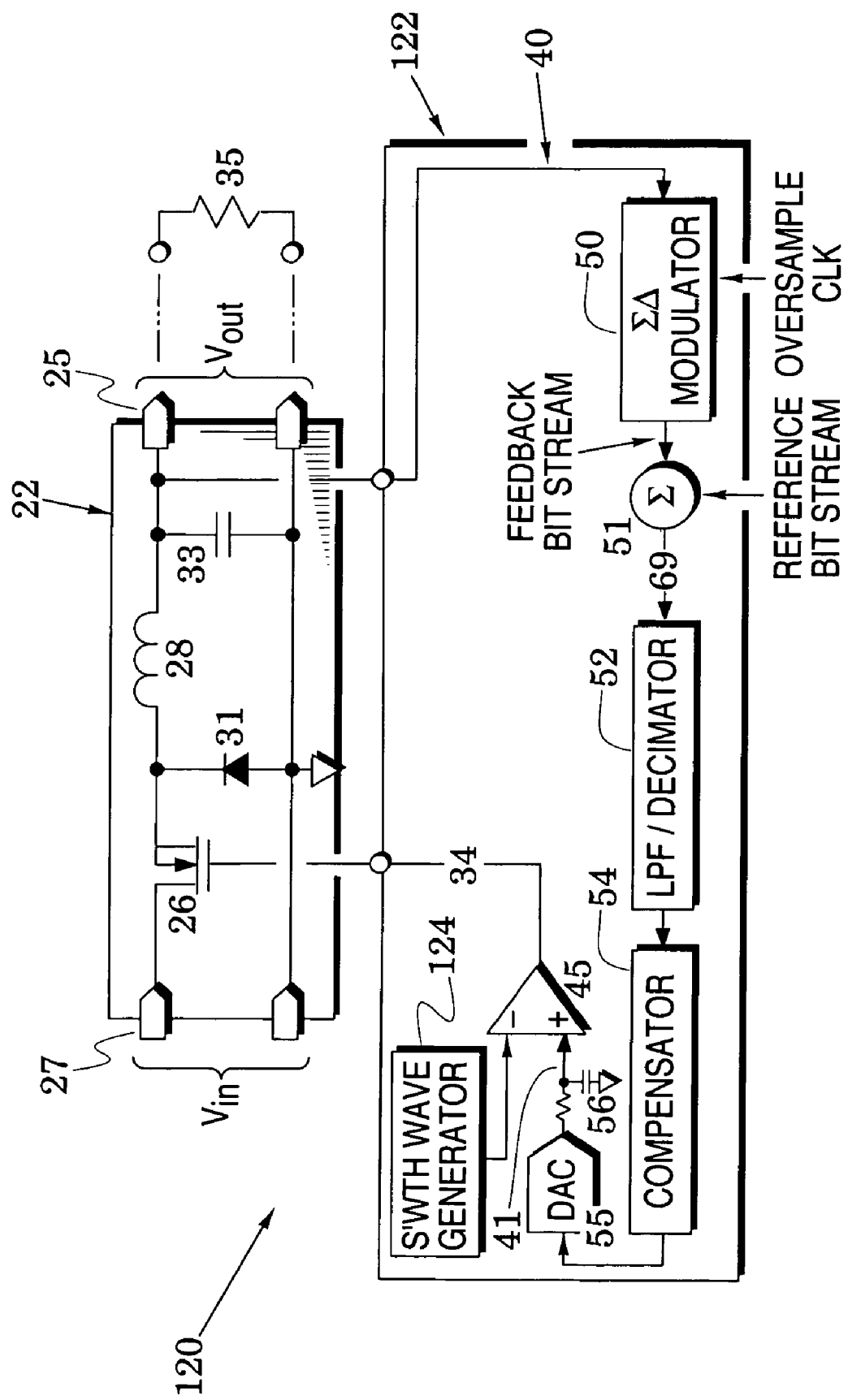

FIG. 10 illustrates a switching converter system embodiment 120 that includes elements of the system 20 of FIG. 1 with like elements indicated by like reference numbers. In a controller 122, however, the current sensor 42 of FIG. 1 is not used and the latch (48 in FIG. 1) is replaced with a sawtooth generator 124 which provides a sawtooth waveform to the comparator 45. The feedback control loop 40 continues to generate the error signal 41 and provide it to the comparator. In response to the difference between the error signal and the sawtooth waveform, the comparator generates the PWM control signal 34 and applies it to the gate of the transistor 26.

In FIG. 1, the sigma-delta modulator 50 and the DAC 55 of the feedback loop 40 are sources of quantization and it is known that the nonlinearity of quantization can be a contributor to an oscillation condition in feedback structures. When the input to a digital filter is zero, for example, rounding errors (due to the finite precision of the filter) create a condition in which the filter output is not necessarily zero. This may lead to an undesirable condition which is often referred to as limit cycle behavior in which the filter output oscillates (i.e., cycles) about zero at a low frequency and disturbs loop stability.

In the controller 24, however, the quantization noise of the DAC 55 is low with respect to the noise of the $\Sigma\Delta$ modulator 50 and this latter noise is inversely proportional to frequency. The $\Sigma\Delta$ modulator's resolution is a function of the oversampling ratio OSR and, at least in theory, is infinite at DC so that there is no zero error bin and no fixed DC operating point in the feedback loop 24. Limit cycle behavior is thus well controlled in the disclosed switched converters.

It has also been found that the current signal 43 can disturb the stability of the system 20 of FIG. 1 when the system's duty cycle exceeds 0.5. This disturbance, however, is easily controlled with the system's digital controller which can be configured to subtract a number from the current signal 43 before it is applied to the comparator 45. In each switching period, this number is rapidly increased from zero to a setting value and this process alters the slope of the current signal in FIG. 2 to insure stable operation.

Figure 11:
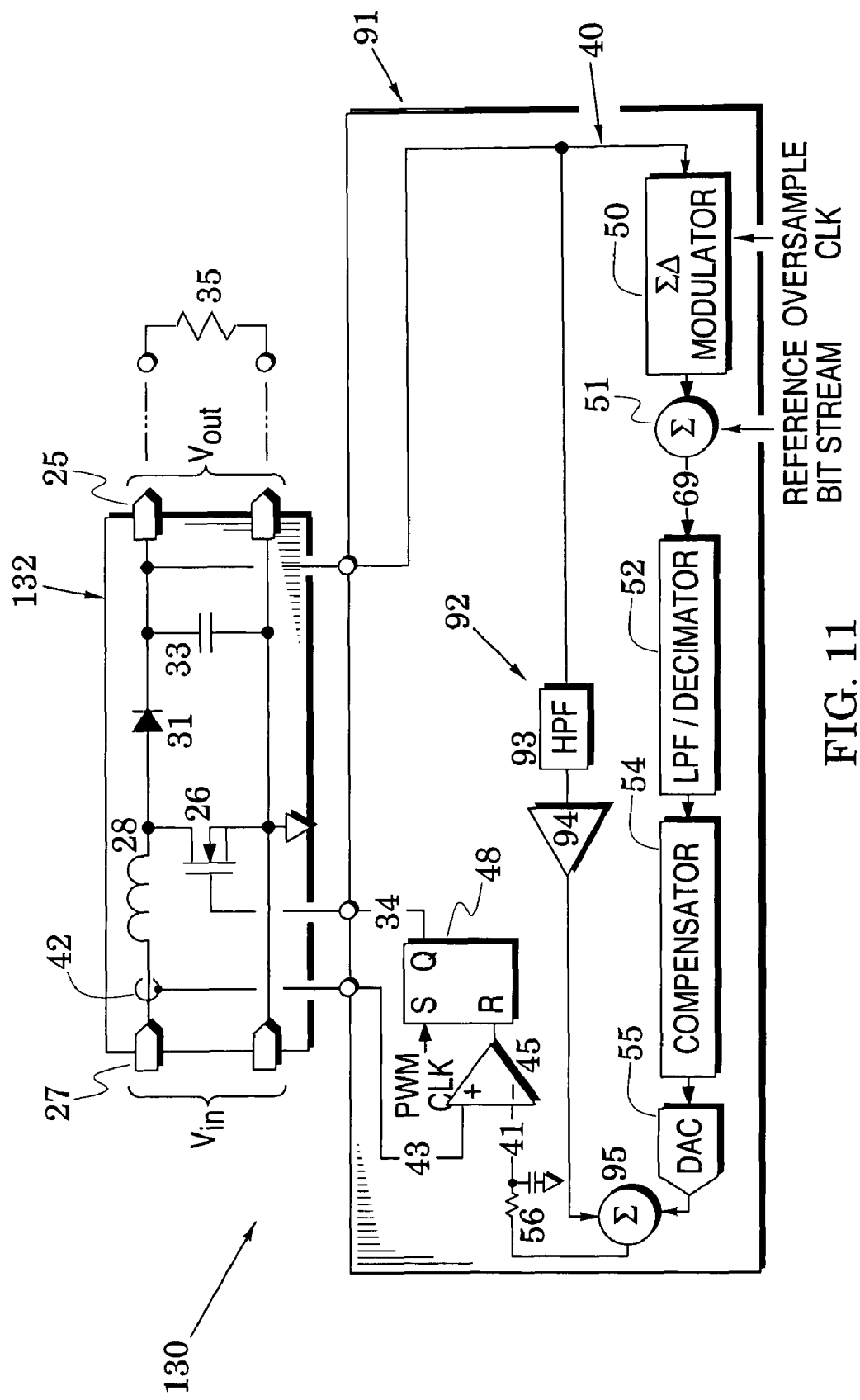

FIG. 11 illustrates a switching converter system embodiment 130 that includes elements of the system 20 of FIG. 1 with like elements indicated by like reference numbers. The system 20 included a controller 20 that was arranged in a buck configuration. In contrast, the system 130 includes a controller 132 that is arranged in a boost configuration. In particular, the controller 132 couples the inductor 28 to the input port 27 with the diode 31 coupled between the inductor and the output port 25. The transistor 26 is now coupled from the junction between the inductor and the diode to ground and the capacitor 33 remains coupled across the output port 25.

The systems of FIGS. 9, 10 and 11 emphasize that the disclosed controller embodiments may be used to control a variety of switched converter embodiments (e.g., buck, boost, buck-boost, and flyback switched converters) and to facilitate digital alteration of system parameters (e.g., loop compensation and voltage reference). The disclosed controller structures digitally generate a loop error signal with a control loop that includes a high-resolution, low-bandwidth sigma-delta modulator and a digital-to-analog converter. Other embodiments include analog generation of a current signal which is differenced with the error signal to provide a control signal to the switching converter. Yet other embodiments include a high-frequency analog feedback path arranged in parallel with the control loop to supplement and enhance its control performance.

The embodiments of the invention described herein are exemplary and numerous modifications, variations and rearrangements can be readily envisioned to achieve substantially equivalent results, all of which are intended to be embraced within the spirit and scope of the appended

I claim:

1. A switching converter system, comprising:
   a switching converter configured with at least one switch arranged to carry a switch current and respond to a pulse-width modulated control signal to thereby provide an output voltage;
   a current sensor coupled to provide a current signal related to the magnitude of said switch current; and
   a control loop configured to digitally generate an error signal in response to a difference between said output voltage and a reference and arranged to provide said control signal in response to a difference between said current signal and said error signal;
   wherein said reference is a reference bit stream and said control loop is configured to modulate said output voltage into a feedback bit stream and digitally process the difference between said feedback bit stream and said reference bit stream into said error signal.

2. The system of claim 1, wherein said control loop includes:
   a sigma-delta ($\Sigma\Delta$) modulator to modulate said output voltage into said feedback bit stream;
   a digital filter configured to filter and decimate a difference between said feedback bit stream and said reference bit stream;
   a digital compensator configured to process the output of said digital filter to stabilize said control loop; and
   a digital-to-analog converter to convert the output of said compensator into said error signal.

3. The system of claim 2, further including:
   a summer inserted into said control loop after said digital-to-analog converter; and
   an analog high-pass filter coupled to receive said output voltage and coupled to said summer.

4. The system of claim 2, wherein said $\Sigma\Delta$ modulator is a second-order $\Sigma\Delta$ modulator.

5. The system of claim 2, wherein said digital filter is a cascaded-integrator-comb filter.

6. The system of claim 2, wherein said compensator is a second digital filter configured to introduce a zero into a transfer function of said control loop.

7. The system of claim 1, wherein said current sensor comprises a resistor.

8. The system of claim 1, wherein said switch comprises a transistor that has a control terminal to receive said control signal and further has a current terminal responsive to said control terminal and wherein said converter further includes:
- a capacitor to support said output voltage;
- an inductor coupled between said current terminal and said capacitor; and
- a diode coupled to said current terminal.

9. The system of claim 8, further including:
- a comparator to compare said current signal and said error signal; and
- a clocked latch to provide said control signal in response to said comparator.

10. The system of claim 9, wherein said latch provides a second control signal and further including a second transistor coupled to said inductor and having a second control terminal coupled to respond to said second control signal.

11. The system of claim 1, wherein said converter is configured as a flyback converter.

12. The system of claim 1, wherein said converter is configured as a buck-boost converter.

13. A switching converter system, comprising:
- a switching converter configured with at least one switch arranged to carry a switch current and respond to a pulse-width modulated control signal to thereby provide an output voltage;
- a generator to provide a sawtooth waveform; and
- a control loop configured to digitally generate an error signal in response to a difference between said output voltage and a reference and arranged to provide said control signal in response to a difference between said sawtooth waveform and said error signal:
- wherein said reference is a reference bit stream and said control loop is configured to modulate said output voltage into a feedback bit stream and digitally process the difference between said feedback bit stream and said reference bit stream into said error signal.

14. The system of claim 13, wherein control loop includes:
- a sigma-delta modulator to modulate said output voltage into said feedback bit stream;
- a digital filter configured to filter and decimate a difference between said feedback bit stream and said reference bit stream;
- a digital compensator configured to process the output of said digital filter to stabilize said control loop; and
- a digital-to-analog converter to convert the output of said compensator into said error signal.

15. A switching converter system, comprising:
- a switching converter configured with at least one switch arranged to carry a switch current and respond to a pulse-width modulation control signal to thereby provide an output voltage;
- a current sensor coupled to provide a current signal in response to said switch current; and
- a feedback control loop configured to digitally modulate said output voltage into an error signal and differ said current signal and said error signal to provide said control signal;
- wherein said control loop includes:
- a sigma-delta modulator to modulate said output voltage into a feedback bit stream;
- a digital filter configured to decimate a difference between said feedback bit stream and a reference bit stream;
- a compensator configured to respond to said digital filter and stabilize said control loop; and
- a digital-to-analog converter to provide said error signal in response to said compensator.

16. The system of claim 15, further including:
- a comparator to compare said current signal and said error signal; and
- a clocked latch to provide said control signal in response to said comparator.

17. The system of claim 15, wherein said digital filter is a cascaded-integrator-comb filter and said compensator is configured to introduce a stabilizing zero into a transfer function of said control loop.

* * * * *